United States Patent
Cherednick et al.

(10) Patent No.: US 7,233,095 B2
(45) Date of Patent: Jun. 19, 2007

(54) SINGLE CRYSTAL SUBSTRATE AND CUTTING METHOD THEREOF

(75) Inventors: Valentin Cherednick, Nizhny Novgorod (RU); Michail Dvoesherstov, Nizhny Novgorod (RU); Yong Lim Choi, Yongin (KR)

(73) Assignee: LG Innotek Co., Ltd., Seoul (KR)

( * ) Notice: Subject to any disclaimer, the term of this patent is extended or adjusted under 35 U.S.C. 154(b) by 167 days.

(21) Appl. No.: 10/517,067
(22) PCT Filed: Jun. 25, 2003
(86) PCT No.: PCT/KR03/01239
§ 371 (c)(1), (2), (4) Date: Dec. 3, 2004
(87) PCT Pub. No.: WO2004/004119
PCT Pub. Date: Jan. 8, 2004

(65) Prior Publication Data
US 2005/0146243 A1 Jul. 7, 2005

(30) Foreign Application Priority Data

| Jun. 26, 2002 | (KR) | 10-2002-0036007 |
| Jun. 26, 2002 | (KR) | 10-2002-0036008 |
| Jun. 26, 2002 | (KR) | 10-2002-0036009 |
| Aug. 9, 2002 | (KR) | 10-2002-0046999 |
| Aug. 9, 2002 | (KR) | 10-2002-0047000 |
| Aug. 9, 2002 | (KR) | 10-2002-0047001 |
| Aug. 9, 2002 | (KR) | 10-2002-0047002 |

(51) Int. Cl.
*H01L 41/08* (2006.01)

(52) U.S. Cl. .............................. 310/313 A; 310/313 D
(58) Field of Classification Search ............ 310/313 A, 310/313 B, 313 R, 360, 361
See application file for complete search history.

(56) References Cited

U.S. PATENT DOCUMENTS

| 5,917,265 A | 6/1999 | Naumenko et al. |
| 6,005,325 A * | 12/1999 | Inoue et al. ............ 310/313 A |
| 6,031,315 A | 2/2000 | Abbott |
| 6,097,131 A | 8/2000 | Naumenko et al. |
| 6,140,738 A * | 10/2000 | Inoue et al. ............ 310/313 A |
| 6,194,809 B1 | 2/2001 | Takeuchi et al. |
| 6,369,667 B1 | 4/2002 | Kadota et al. |

FOREIGN PATENT DOCUMENTS

| WO | WO-99/04488 A1 | 1/1999 |
| WO | WO-99/48200 A1 | 9/1999 |

* cited by examiner

*Primary Examiner*—Mark Budd
(74) *Attorney, Agent, or Firm*—Birch, Stewart, Kolasch & Birch, LLP

(57) ABSTRACT

A single crystal substrate and a cutting method thereof are provided. The single crystal substrate includes a langasite substrate with a SAW propagation surface; and input and output IDTs having electrodes on the surface for launching and/or detecting surface acoustic waves, wherein a direction of surface wave propagation is parallel to an X'-axis, and the substrate farther has an Z'-axis perpendicular to the surface and a Y'-axis parallel to the surface and perpendicular to the X'-axis, the langasite substrate having a crystal orientation defined by modified axes X, Y and Z, the relative orientation of axes X', Y' and Z' being defined by Euler angles $\phi$, $\theta$ and $\psi$, in which $\phi$ is in a range of $8° \leq \phi \leq 25°$, $\theta$ in a range of $15° \leq \theta \leq 30°$, and $\psi$ is in a range of $55° \leq \psi \leq 85°$.

12 Claims, 14 Drawing Sheets

<Stress on piezoelectric>

SINGLE CRYSTAL SUBSTRATE AND CUTTING METHOD THEREOF

TECHNICAL FIELD

The present invention relates to a SAW (Surface Acoustic Wave) device, and more particularly, to a single crystal substrate and a cutting method thereof, with optimal parameter characteristics, by providing optimal cutting orientations of a single crystal substrate for used in the SAW devices.

BACKGROUND ART

In recent years, demands of a mobile communication terminal as a wireless communication means, such as a car telephone, a mobile phone in a train and on the street, has been explosively increased worldwide. To make the mobile communication possible, not only the network system itself but also terminals for interfacing with users directly are required to have a small size, light weight, low power consumption and high performance.

Actually small size parts used in the terminals are the ones contributing to the size reduction of the mobile terminals. Particularly, SAW devices are currently used as band-pass filters, resonators, delay lines, and convolvers, in a wide range of RF and IF applications, for example, wireless, cellular communication, and cable TV.

In general, the SAW is material wave generated by motions of particles in presence of thermal, mechanical and electrical forces from the outside, and exists only in solid or liquid.

Basically, waves can be divided into three kinds: longitudinal waves, in which the direction of wave propagation is parallel to the particle displacement, transversal waves, in which the direction of wave propagation is perpendicular to the particle displacement (oscillation), and shear waves, which are obtained by adding horizontal vectors and vertical vectors.

The most effective and general method for generating or detecting the SAW device out of piezoelectric substrate is fabricating IDT (InterDigital Transducer) structures. The IDT aligns metal electrodes in parallel on the piezoelectric substrate, and the pattern at this time is similar to the time impulse pattern.

Mostly IDT of each electrode is fabricated through. aluminum deposition, and sometimes aluminum alloy is also used to increase voltage-resistant property. Also, Ti or specific alloy is used to improve contact property of aluminum. In general, the width of aluminum used ranges from 0.5 μm to 15 μm.

FIG. 1 is a schematic perspective view of a SAW device of the related art.

As shown in FIG. 1, when an alternating signal voltage is applied to an input IDT 101, electric field is generated between other neighboring electrodes with different polarity and piezoelectric effect is created on the surface of a substrate 104. As a result, the surface of the substrate 104 is transformed and SAW is propagated to both directions of the input IDT 101.

FIG. 2 is a schematic diagram illustrating transformation brought on the inside of the piezoelectric substrate due to SAW according to the related art.

As depicted in the drawing, when SAW is propagated, the substrate is transformed and the SAW is transferred in the form of mechanical energy.

Then an output IDT 102 on the opposite side detects the energy when SAW is propagated, using inverse piezoelectric effect from where the energy is formed to each electrode.

On the other hand, to block unnecessary reflective waves, both ends of the surface of the substrate 104 can be coated with an acoustic absorbent 103.

As for the acoustic absorbent, rubber, silicon gel, photosensitive film, or polyamide can be used, and its coating shape is also diverse.

Therefore, characteristics of the SAW device are determined by input/output IDT patterns for converting electrical signals to mechanical energies or mechanical energies to electrical signals, and by how the pattern sizes are adjusted.

Usually the SAW device with the above construction is used as the band-pass filter. This application turned out to be very beneficial for reducing weight and size, increasing reliability and reducing power consumption. Typically used SAW filters are transversal SAW filters having two IDTs disposed on the piezoelectric substrate at a predetermined distance, resonator filters mounted with a resonator on the piezoelectric substrate, and combination filters.

To develop the SAW filter, technologies involved in electrode designing, patterning, SMD packaging, measurement of RF characteristics, and circuit designing for used in impedance matching should be organically correlated to each other and systemized.

In general, quartz, lithium niobate ($LiNbO_3$), ST-quartz and lithium tantalate ($LiTaO_3$) are used to fabricate a SAW single crystal substrate used in patterning for SAW propagation.

Because the SAW filter is heavily influenced by properties of those piezoelectric single crystal substrates that generate and propagate surface acoustic waves, it is very important to set up specific orientations for different properties and to cut the substrates accordingly.

The properties to be considered are SAW velocity, SAW coupling coefficient, power flow angle (pfa), diffraction or beam spreading coefficient, Y (gamma), or temperature coefficient of delay. Depending on these properties, the SAW device may or may not obtain radio frequency.

Especially the first order temperature coefficient of delay (tcd) among other properties is very sensitive to frequency change, and thus the usefulness of the SAW device as a temperature sensor is very high.

FIG. 3 is a schematic diagram of a SAW device of the related art being used as a temperature sensor.

As illustrated in FIG. 3, there are input IDT and output IDT on a single crystal substrate. When a voltage is applied to the input IDT, electric signals are converted to mechanical energies and SAW is propagated along the single crystal substrate. Here, if temperature is changed, frequency of the SAW to be propagated is changed also. Then the SAW with a changed frequency, now being in the form of mechanical energy, is converted back to electrical signals at the output IDT and outputted therefrom.

The frequencies of output signals are amplified through an amplifier, and the amplified signals are transmitted wirelessly. When the transmitted signals are received, the frequencies of the signals are measured and temperatures corresponding to frequencies are detected (or sensed).

Following result is obtained by applying quartz Euler angles of the single crystal substrate, that is, $\phi=0°$, $\theta=15.7°$ and $\psi=0°$, to the SAW device.

Vs (km/s)=3.948582, Vo (km/s)=3.95077, K2 (%)=0.1108, pfa (deg)=0, tcd (ppm/C)=0.25181, tcd2 (1e-9/C^2)=-1.8167, loss_s (dB/λ)=0.0003059, and loss_o (dB/λ)=0.0003297.

Where, Vs and Vo are phase velocities for shorted and opened (free) surface respectively, K2 is coupling coefficient, pfa is power flow angle, tcd and tcd2 are first and second order temperature coefficient of delay respectively, and loss_s and loss_o are propagation loss for shortened and opened surface respectively.

On the other hand, following result is obtained by applying lithium tantalate (LiTaO$_3$) Euler angles of the single crystal substrate, that is, $\phi$=10°, $\theta$=23.6°, and $\psi$=78.8°, to the SAW device.

Vs (km/s)=2.969688, Vo (km/s)=2.972704, K2 (%)=0.2029, pfa (deg)=0.03048, tcd (ppm/C)=−0.06127, and tcd2 (1e-9/C^2)=−3.496.

To be short, when the above quartz substrate Euler angles or lithium tantalate substrate Euler angles are applied to the temperature sensor, although the properties do not go through great changes, one cannot obtain an optimal temperature coefficient that is needed for the SAW device to be used as the temperature sensor.

Therefore, it is very important to set specific orientations according to different material properties of the single crystal substrate, namely quartz, langasite or lithium tantalate substrate, when it is applied to the SAW device, and to cut the substrate accordingly. Also, if the SAW device has lower values than demanded, performances of the SAW device are consequently deteriorated.

DISCLOSURE OF THE INVENTION

An object of the invention is to solve at least the above problems and/or disadvantages and to provide at least the advantages described hereinafter.

Accordingly, one object of the present invention is to. solve the foregoing problems by providing a single crystal substrate and a cutting method thereof, with optimal parameter properties, by providing optimal cutting orientations to langasite, quartz and lithium tantalate single crystal substrates for use in the SAW device.

The foregoing and other objects and advantages are realized by providing a single crystal substrate includes a langasite substrate with a SAW propagation surface; and input and output IDTs having electrodes on the surface for launching and/or detecting surface acoustic waves, wherein a direction of surface wave propagation is parallel to an X'-axis, and the substrate further has an Z'-axis normal to the surface and a Y'-axis parallel to the surface and perpendicular to the X'-axis, the langasite substrate having a crystal orientation defined by modified axes X, Y and Z, the relative orientation of axes X', Y'and Z' being defined by Euler angles $\phi$, $\theta$ and $\psi$, in which $\phi$ is in a range of 8°$\leq\phi\leq$25°, $\theta$ is in a range of 15°$\leq\theta\leq$30°, and $\psi$ is in a range of 55°$\leq\psi\leq$85°, or which $\phi$ is 0°, $\theta$ is in a range of 12°$\leq\theta\leq$17°, and $\psi$ is in a range of 73°$\leq\psi\leq$78°.

Preferably, the optimal Euler angles of the langasite are $\phi$=10°, $\theta$=23.6° and $\psi$=78.8°; or $\phi$=0°, $\theta$=14.6° and $\psi$=76.2°.

Also, a single crystal substrate includes a quartz substrate with a SAW propagation surface; and input and output IDTs having electrodes on the surface for launching and/or detecting surface acoustic waves, wherein a direction of surface wave propagation is parallel to an X'-axis, and the substrate further has an Z'-axis normal to the surface and a Y'-axis parallel to the surface and perpendicular to the X'-axis, the quartz substrate having a crystal orientation defined by modified axes X, Y and Z, the relative orientation of axes X', Y' and Z' being defined by Euler angles $\phi$, $\theta$ and $\psi$, in which $\phi$ is in a range of −5°$\leq\phi\leq$+5°, $\theta$ is in a range of 60°$\leq\theta\leq$80° and $\psi$ is in a range of −5°$\leq\psi\leq$+5°, or which $\phi$ is 0°, $\theta$ is in a range of 17°$\leq\theta\leq$23° and $\psi$ is in a range of 10°$\leq\psi\leq$20°.

Preferably, the optimal Euler angles of the quartz are $\phi$=0°, $\theta$=70.5° and $\psi$=0°; or $\phi$=0°, $\theta$=20° and $\psi$=13.7°.

Also, a single crystal substrate includes a, lithium tantalate substrate with a SAW propagation surface; and input and output IDTs having electrodes on the surface for launching and/or detecting surface acoustic waves, wherein a direction of surface wave propagation is parallel to an X'-axis, and the substrate further has an Z'-axis normal to the surface and a Y'-axis parallel to the surface and perpendicular to the X'-axis, the lithium tantalate substrate having a crystal orientation defined by modified axes X, Y and Z, the relative orientation of axes X', Y' and Z' being defined by Euler angles $\phi$, $\theta$ and $\psi$, in which $\phi$ is in a range of −5°$\leq\phi\leq$+5°, $\theta$ is in a range of 70°$\leq\theta\leq$90° and $\psi$ is in a range of 85°$\leq\psi\leq$95°, or which $\phi$ is in a range of −5°$\leq\phi\leq$+5°, $\theta$ is in a range of 160°$\leq\theta\leq$180° and $\psi$ is in a range of 85°$\leq\psi\leq$95°, or which $\phi$ is in a range of −5°$\leq\phi\leq$+5°, $\theta$ is in a range of 20°$\leq\theta\leq$40° and $\psi$ is in a range of 5°$\leq\psi\leq$25°.

Preferably, the optimal Euler angles of the lithium tantalate are $\phi$=0°, $\theta$=79° and $\psi$=90°; $\phi$=0°, $\theta$=168° and $\psi$=90°; or $\phi$=0°, $\theta$=30° and $\psi$=16.5°.

According to another aspect of the invention, a cutting method of a single crystal substrate includes the steps of:

(a) defining a crystal orientation based on modified axes X, Y and Z, for the surface of the single crystal substrate which surface acoustic waves are propagated;

(b) defining X', Y' and Z' axes on the single crystal substrate, in which a direction of surface wave of the propagation is parallel to X'-axis and the Z'-axis is normal to the surface wave and the Y'-axis is parallel to the surface and normal to the X'-axis;

(c) defining the X', Y' and Z' axes defined at (b) as relative orientation Euler angles of crystals, $\phi$, $\theta$ and $\psi$; and (d) setting a range of the $\phi$, $\theta$, and $\psi$ defined at (c) in an optimal range.

Preferably, the single crystal substrate is a langasite substrate, a quartz substrate, or a lithium tantalate substrate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

<Embodiment 1: Langasite Substrate>

Figure 1:
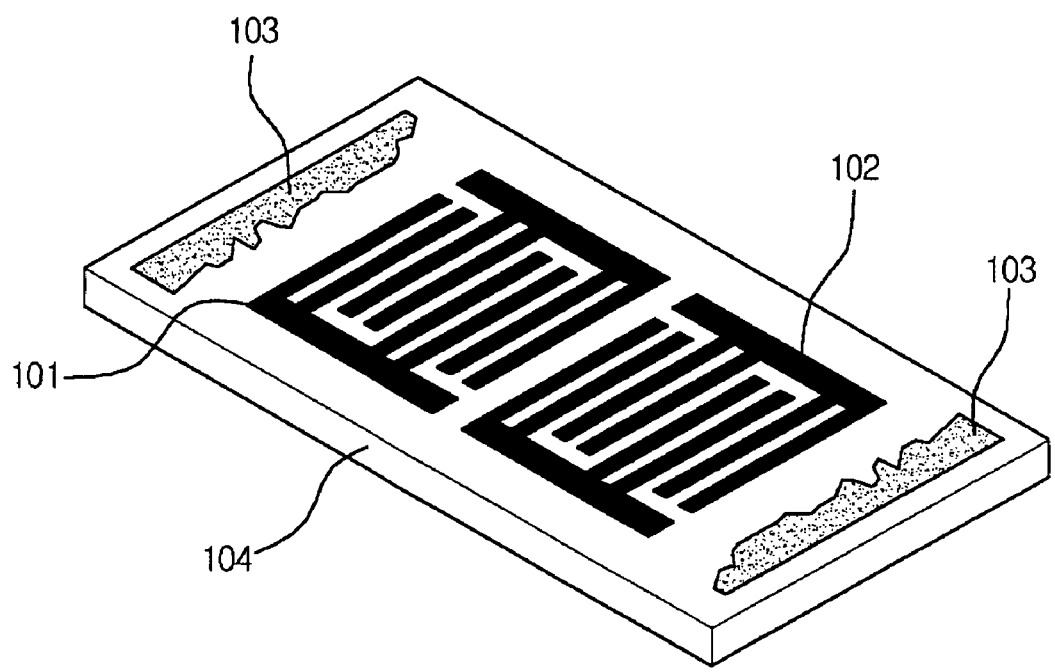
FIG. 1 is a schematic perspective view of a SAW device of the related art.
Figure 2:
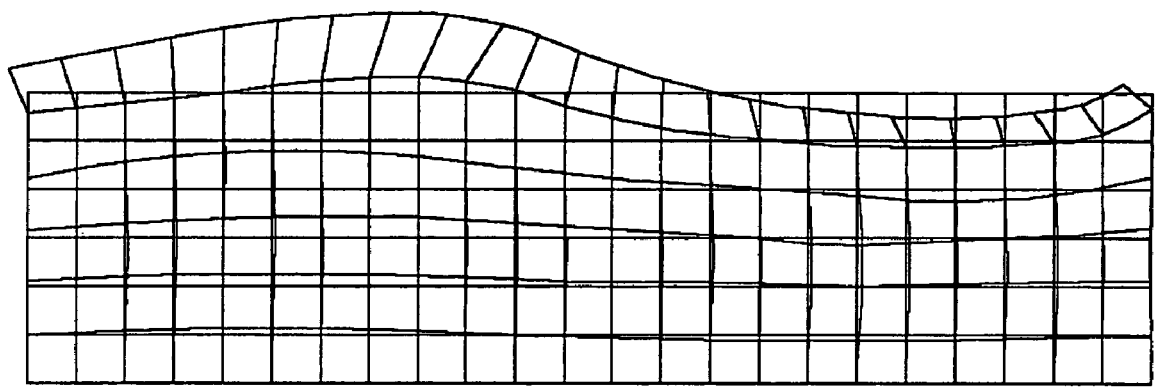
FIG. 2 is a schematic diagram illustrating transformation brought on the inside of the piezoelectric substrate due to surface acoustic waves of the related art.
Figure 3:
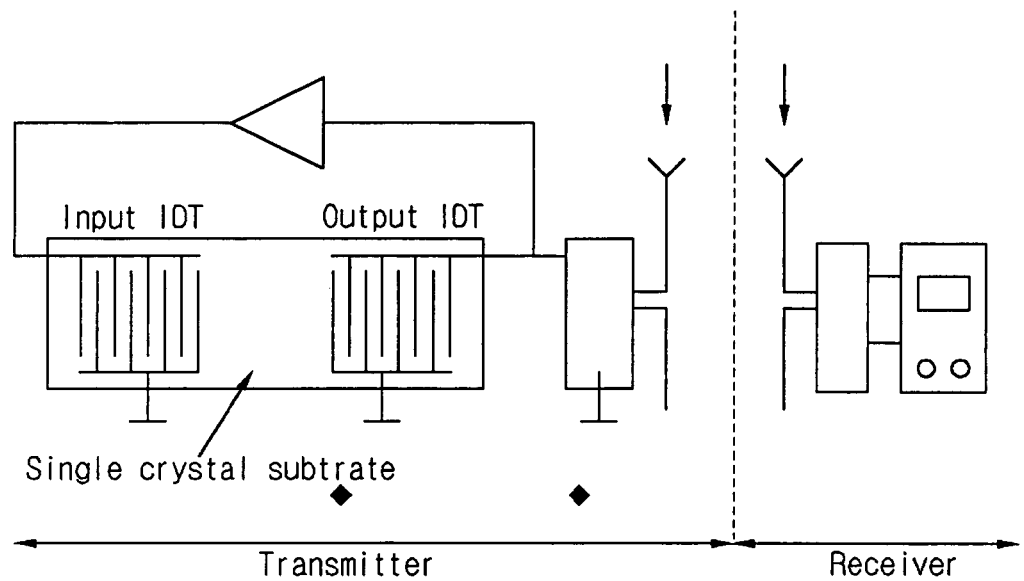
FIG. 3 is a schematic diagram of a SAW device of the related art being used as a temperature sensor.
Figure 4:
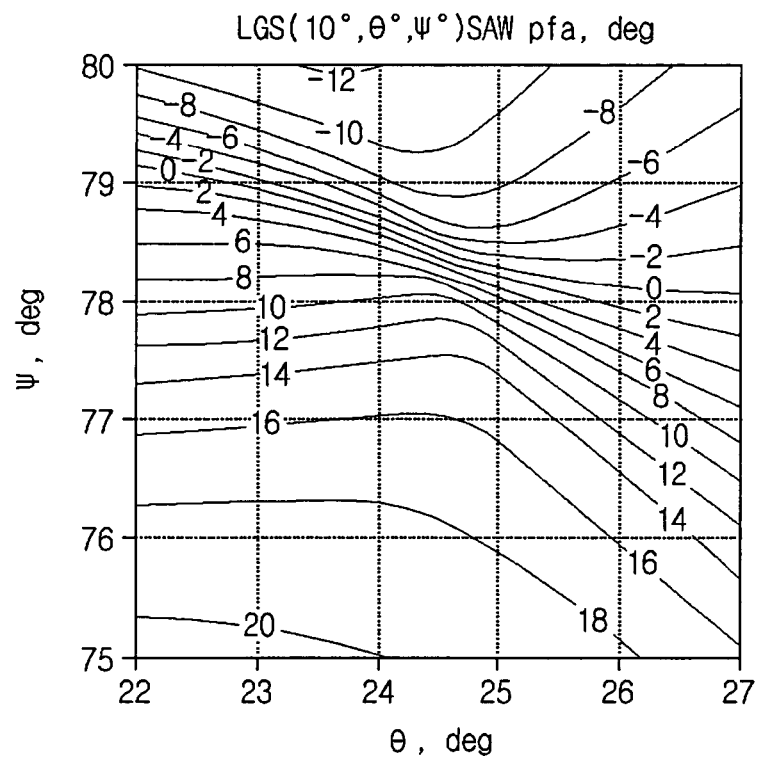
Figure 5:
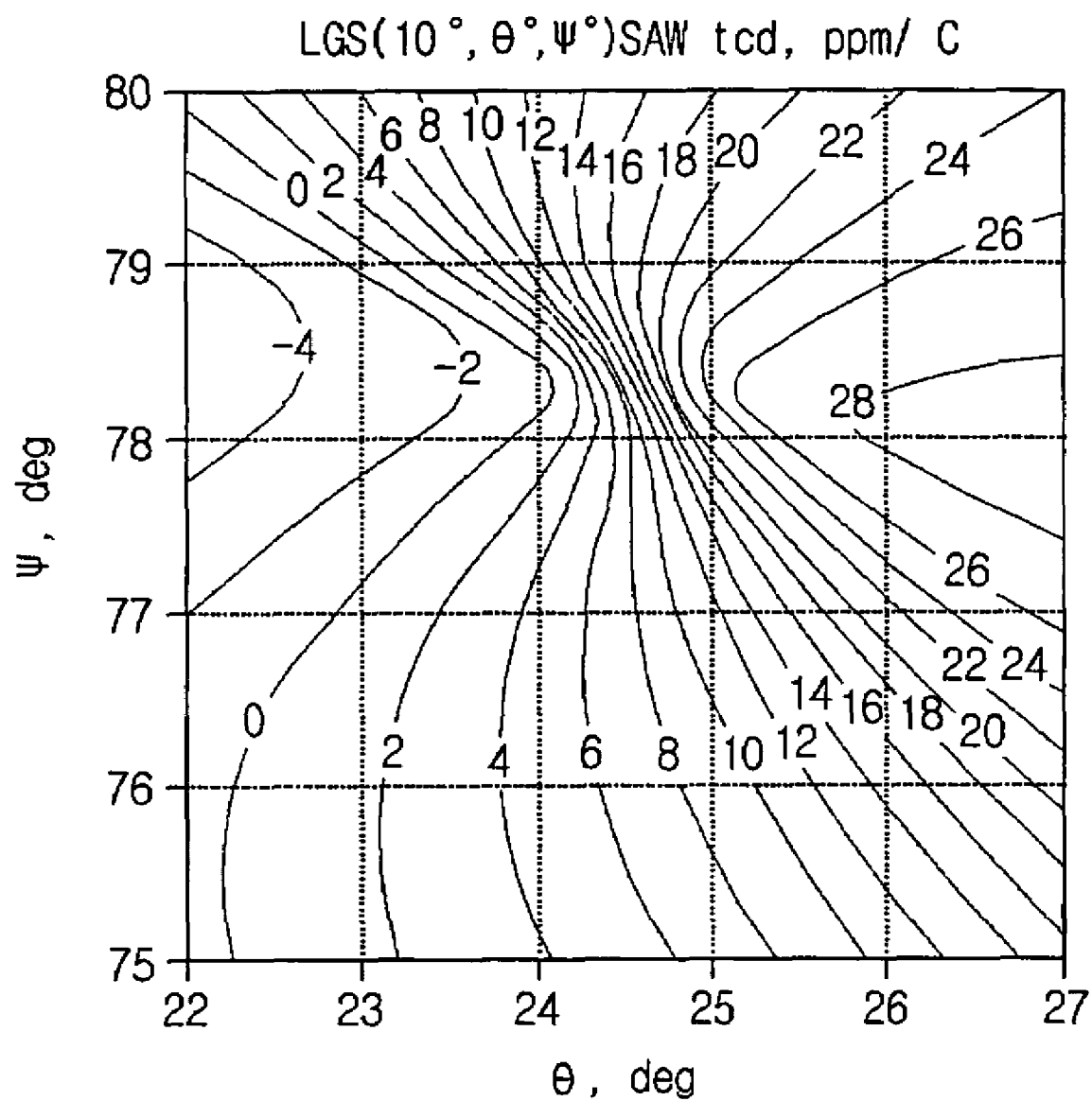
Figure 6:
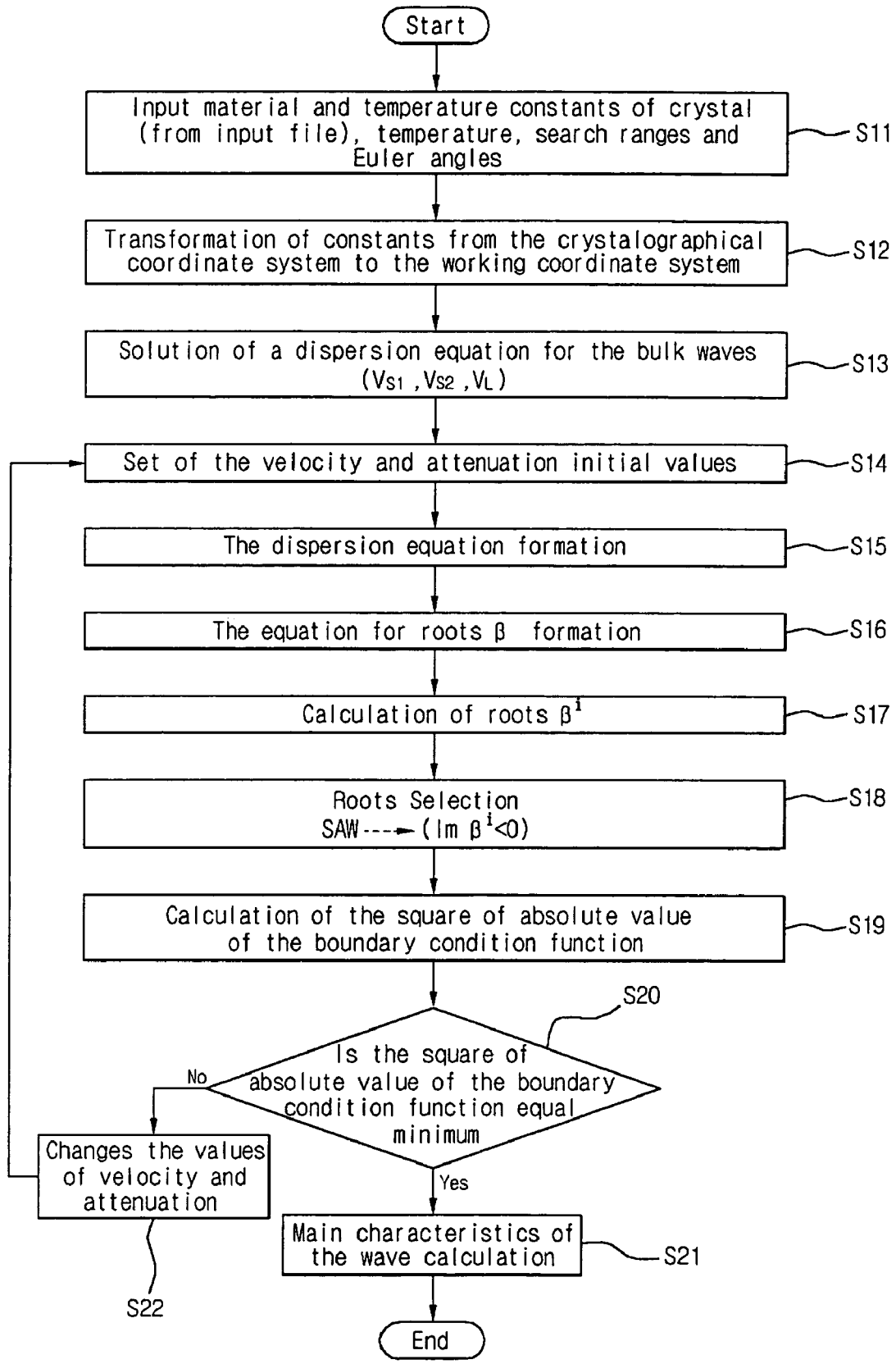

FIG. 4 is a contour map of pfa when Euler angle $\phi$=10° in a langasite substrate of the SAW device according to one embodiment of the present invention;

FIG. 5 is a contour map of tcd when Euler angle $\phi$=10° in the langasite substrate of the SAW device according to one embodiment of the present invention;

FIG. 6 is a flowchart illustrating a simulation method of a single crystal substrate of an SAW device according to the present invention.

Figure 7:
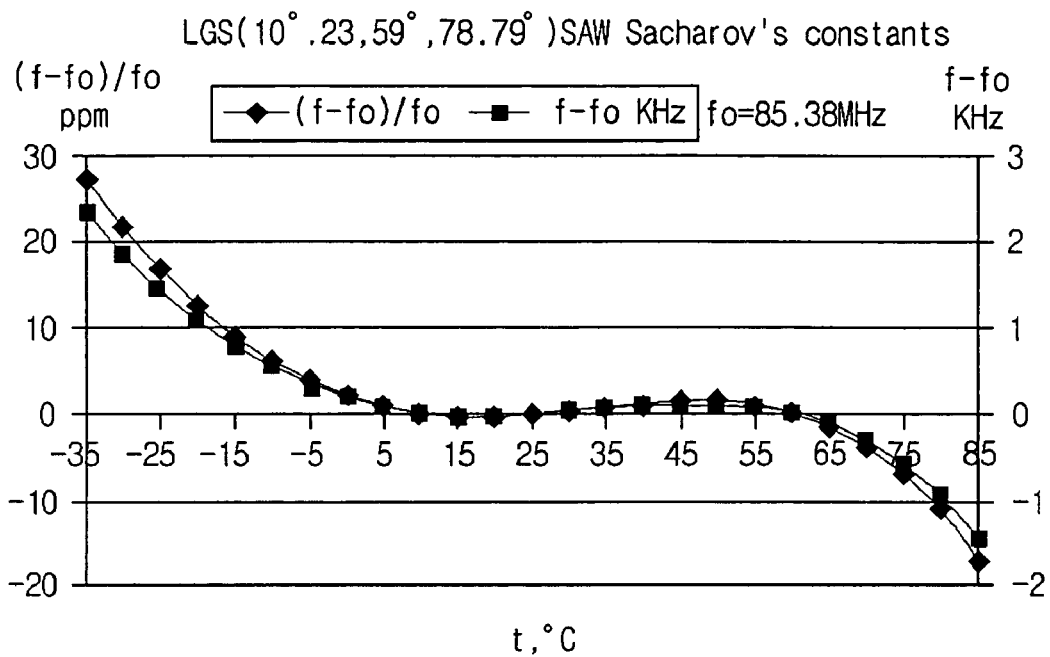
Figure 8:
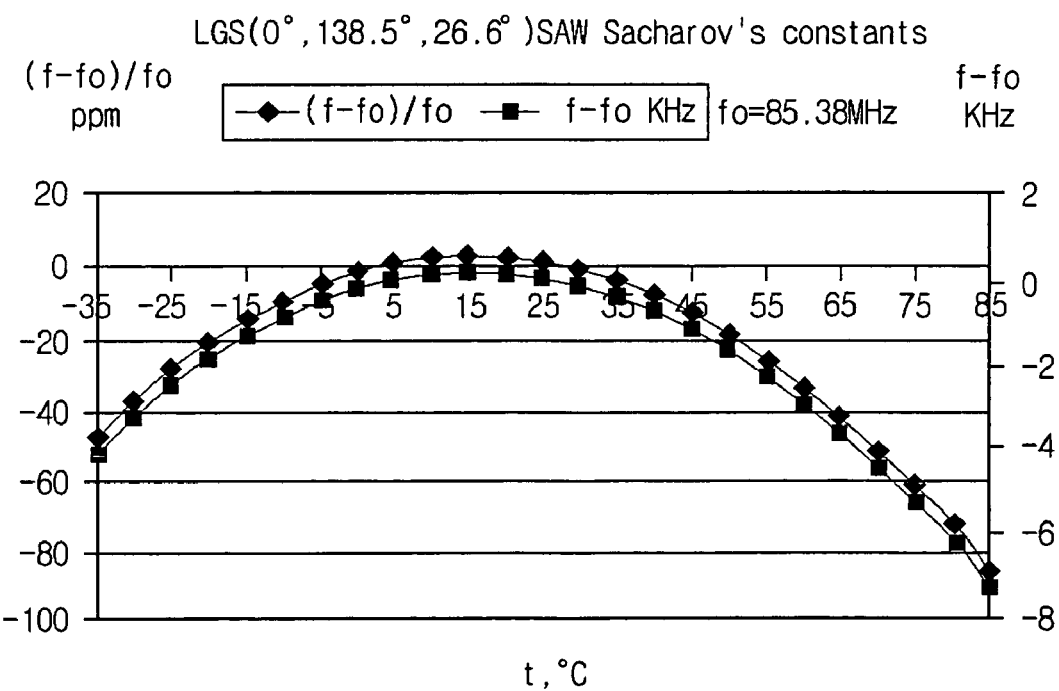
Figure 9:
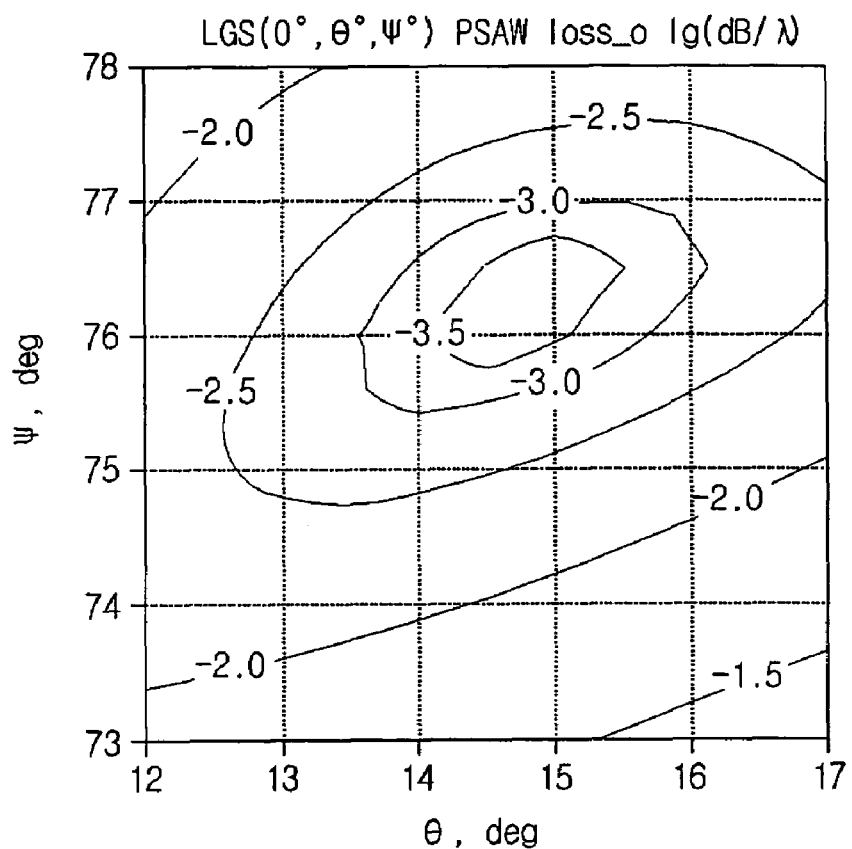

FIG. 7 illustrates temperature dependencies for Euler angles (10°, 23.6°, and 78.8°) in the langasite substrate of the SAW device according to one embodiment of the present invention;

FIG. 8 illustrates temperature dependencies for Euler angles (0°, 138.5°, and 26.6°) in a langasite substrate of the SAW device of the related art;

FIG. 9 is a contour map of propagation loss for LGS PSAW when Euler angle $\phi=0°$ in the langasite substrate of the SAW device according to another embodiment of the present invention;

<Embodiment 2: Quartz Substrate>

Figure 10:
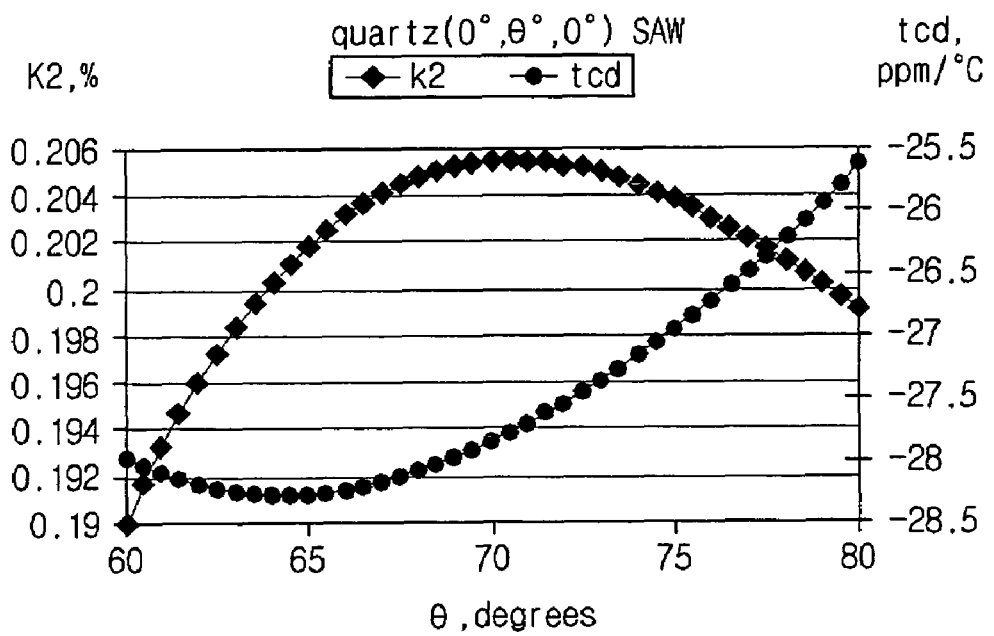
Figure 11:
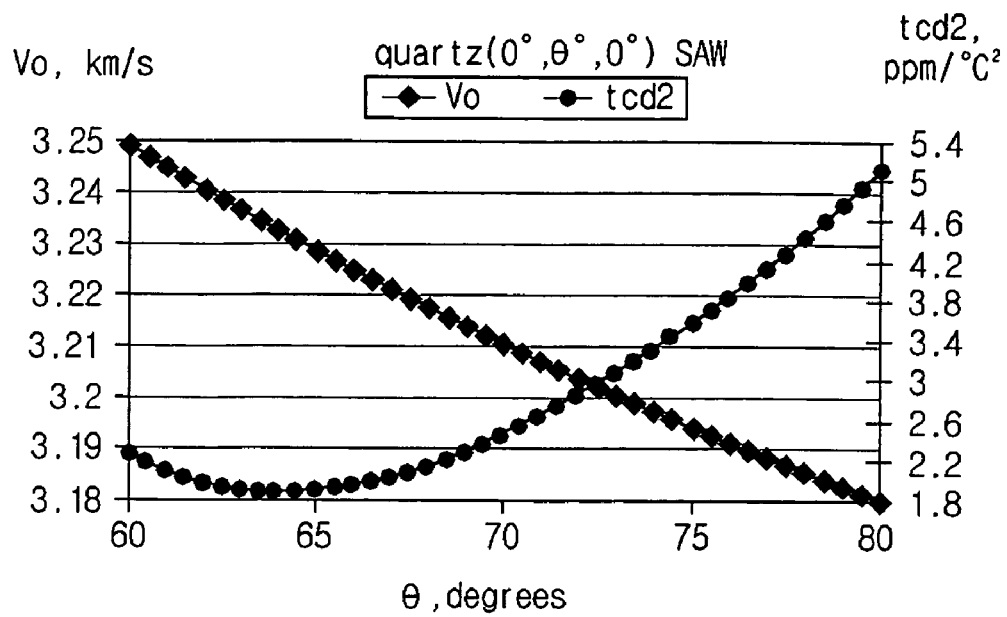
Figure 12:
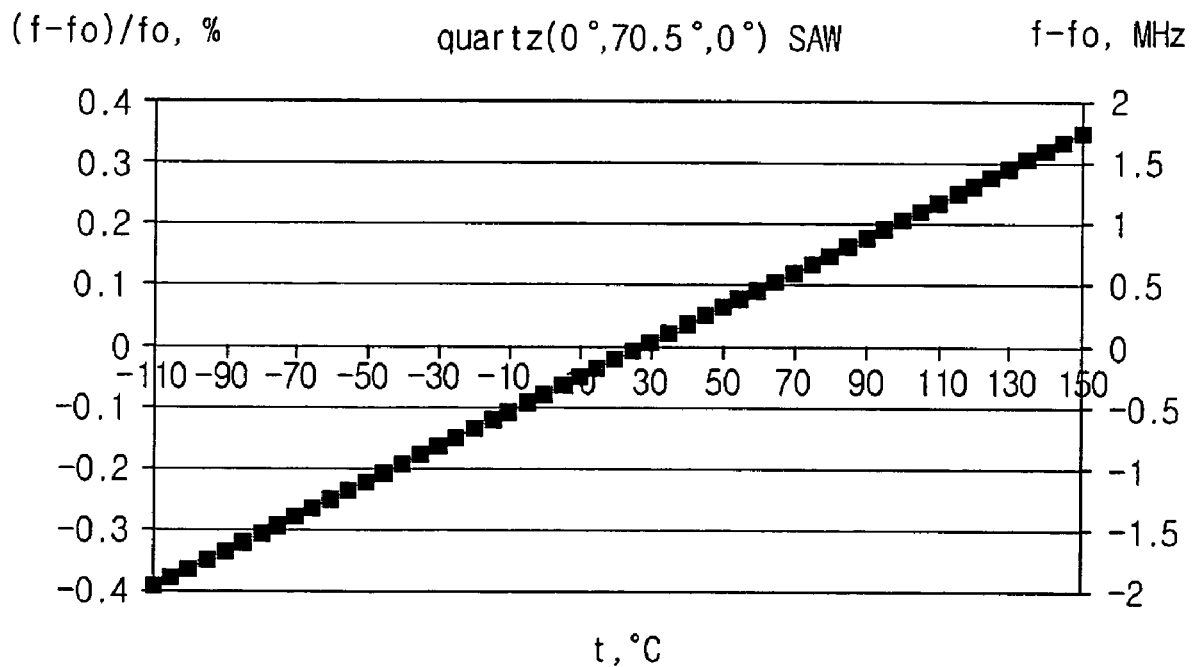
Figure 13:
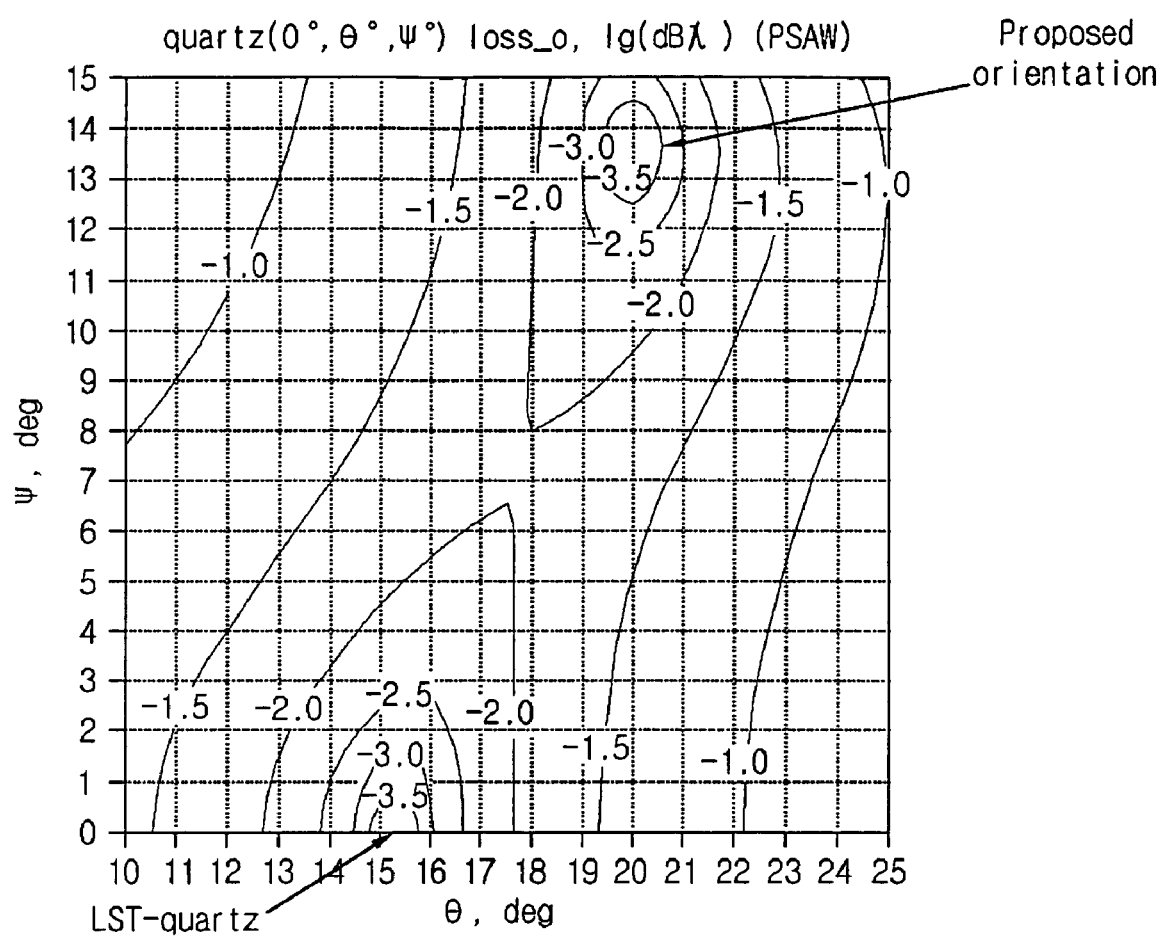

FIG. 10 shows a relationship between the coupling coefficient (K2) and the first order temperature coefficient of delay (tcd) when Euler angles $\phi=0°$, $\theta=\theta°$ ($\theta°$ refers to an arbitrary angle) and $\psi=0°$ in a quartz substrate of the SAW device according to one embodiment of the present invention;

FIG. 11 shows a relationship between the phase velocity for opened surface (Vo) and the second order temperature coefficient of delay (tcd2) when Euler angles $\phi=0°$, $\theta=\theta°$ ($\theta°$ refers to an arbitrary angle) and $\psi=0°$ in the quartz substrate of the SAW device according to one embodiment of the present invention;

FIG. 12 shows dependency of a frequency on a temperature when Euler angles $\phi=0°$, $\theta=70.5°$ and $\psi=0°$ in the quartz substrate of the SAW device according to one embodiment of the present invention;

FIG. 13 illustrates minimum propagation loss when Euler angles $\phi=0°$, $\theta=20°$ and $\psi=13.7°$ in the quartz substrate of the SAW device according to another embodiment of the present invention;

<Embodiment 3: Lithium Tantalate Substrate>

Figure 14:
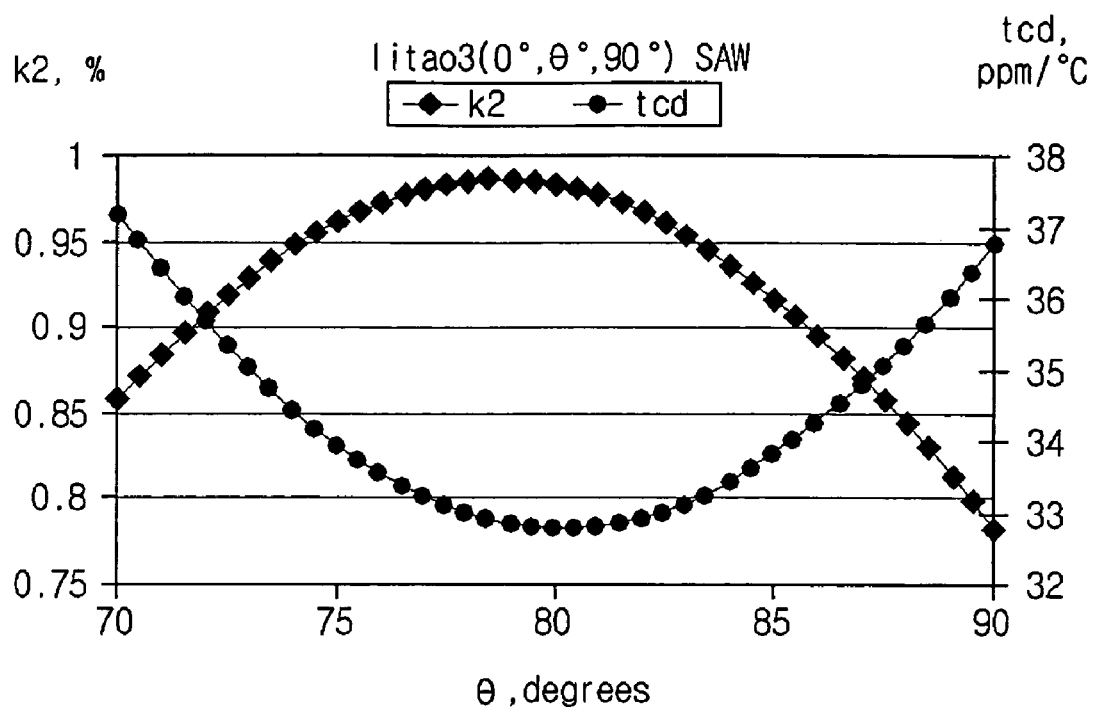
Figure 15:
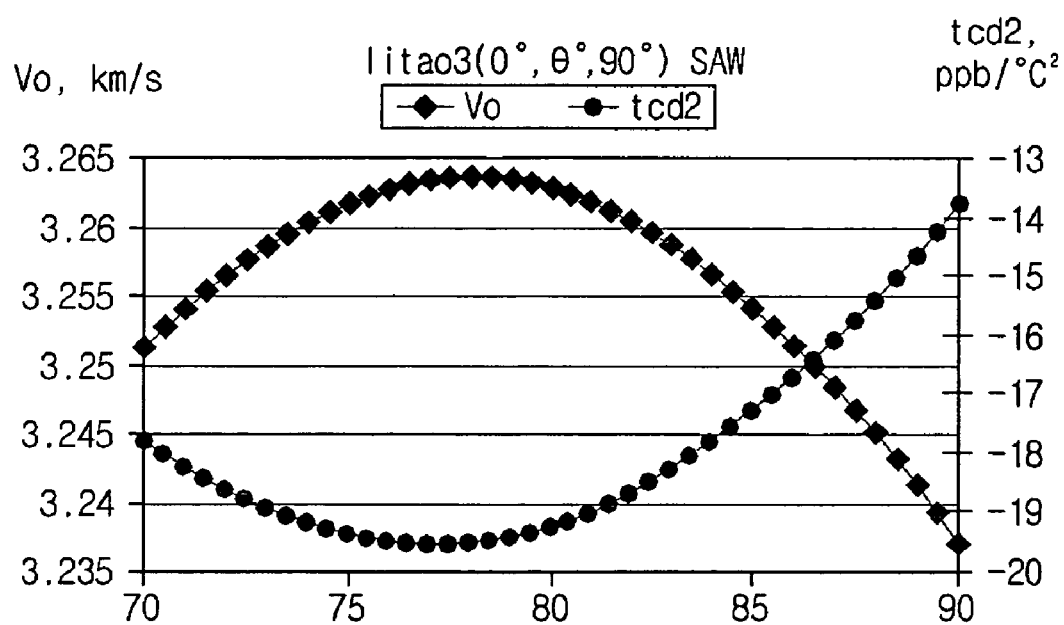
Figure 16:
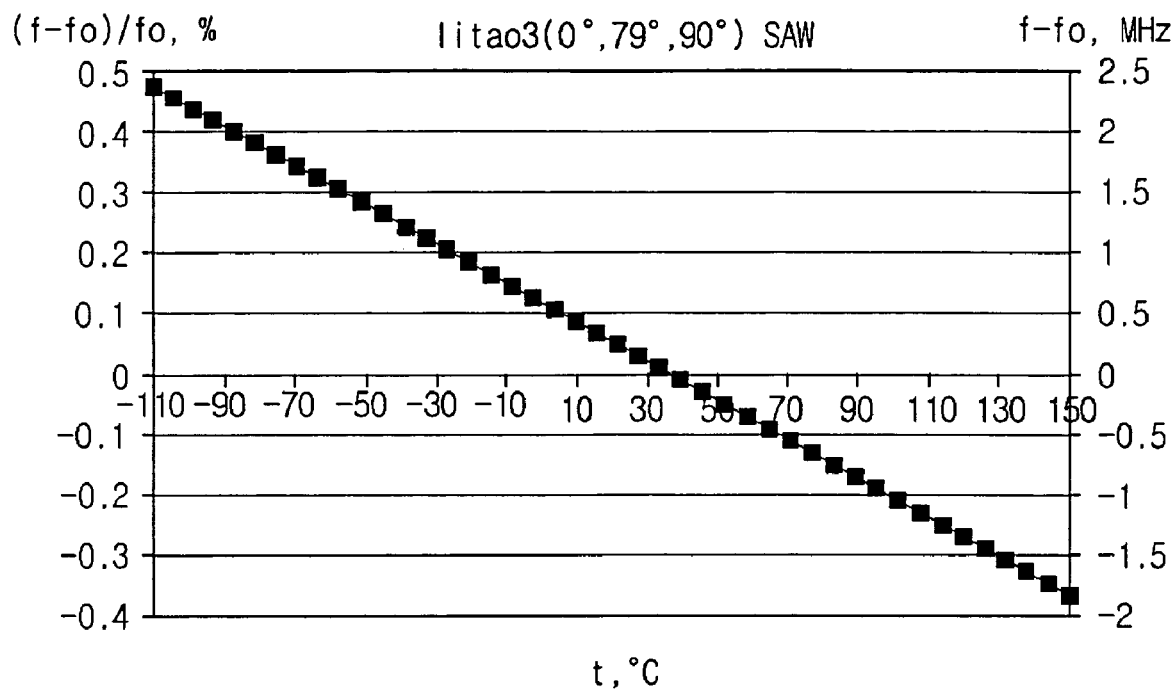
Figure 17:
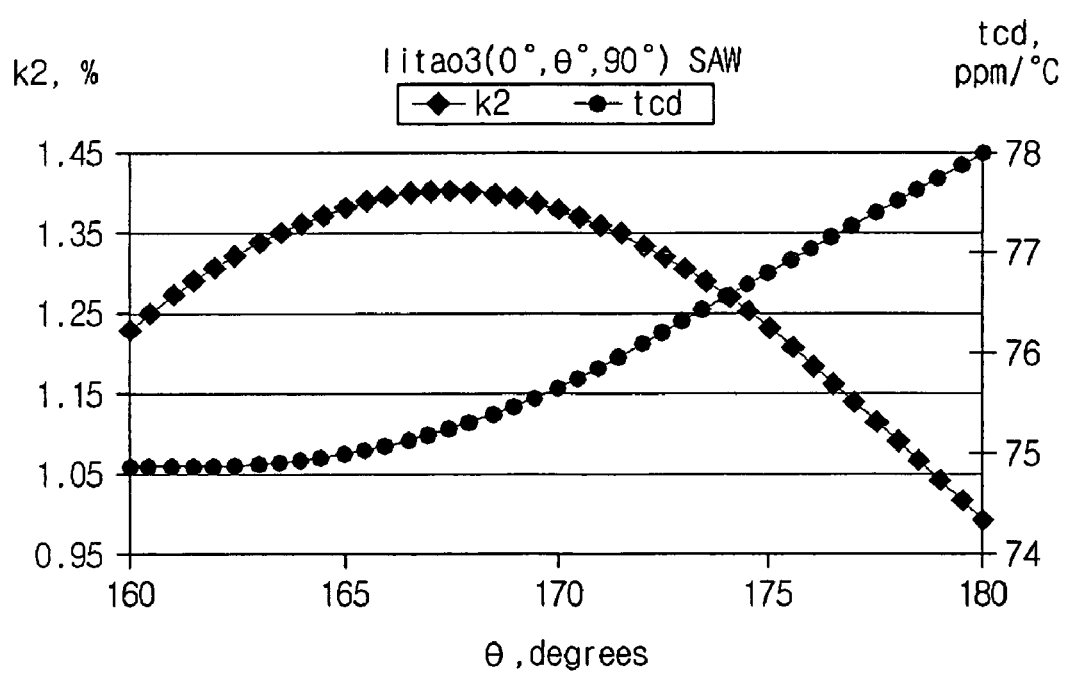
Figure 18:
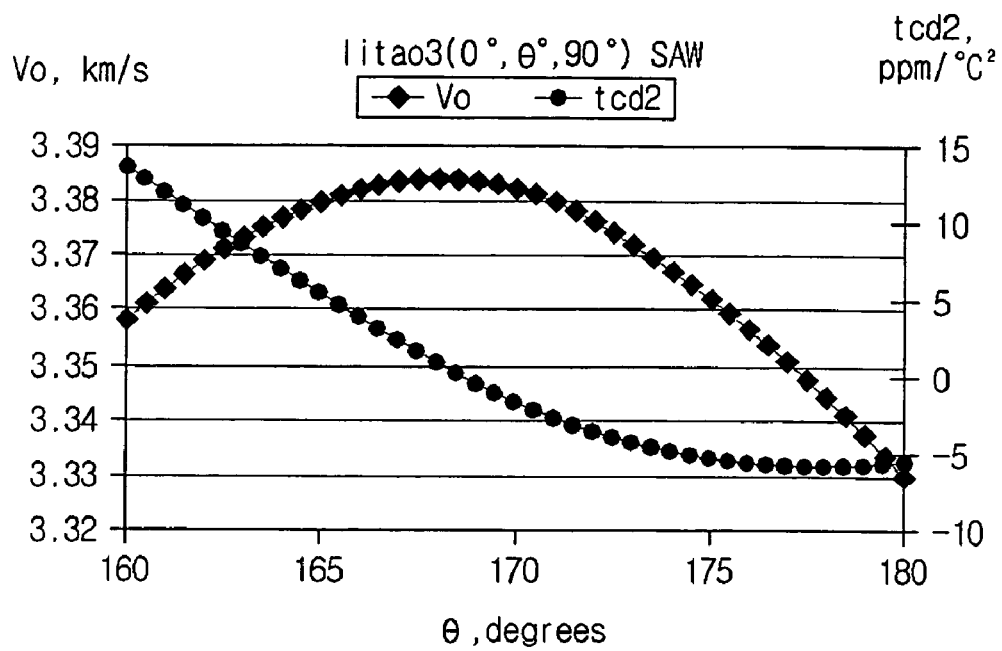
Figure 19:
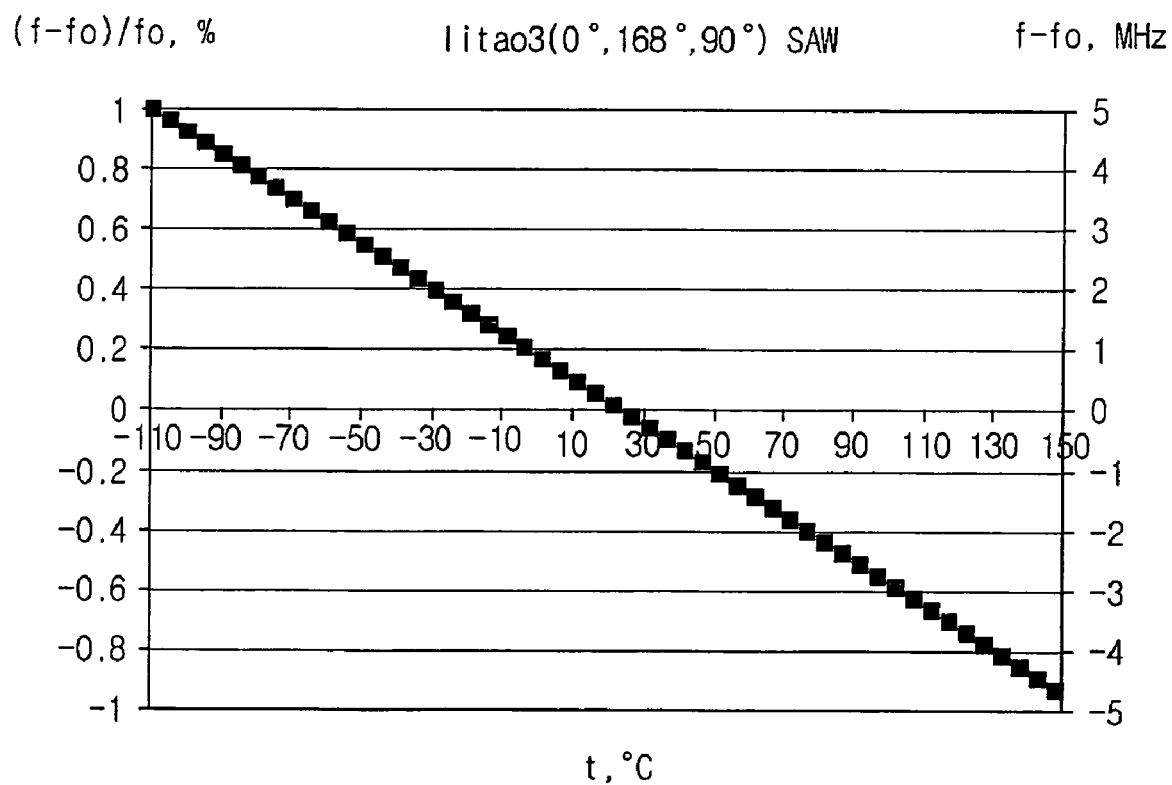
Figure 20:
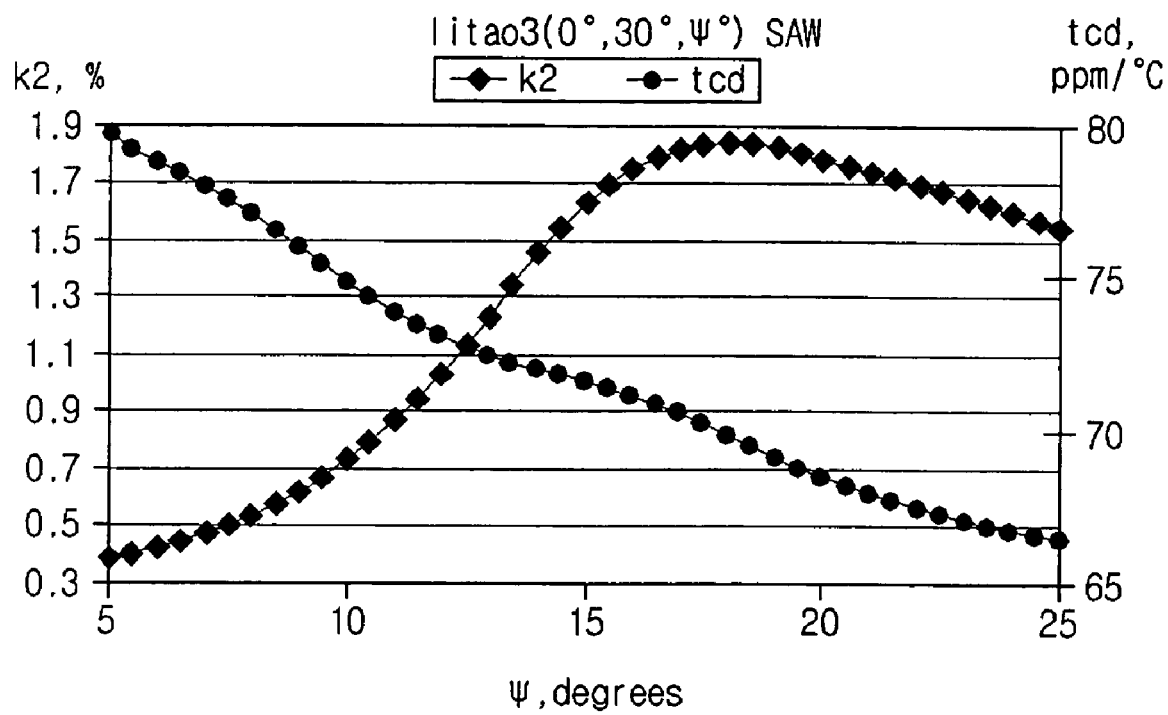
Figure 21:
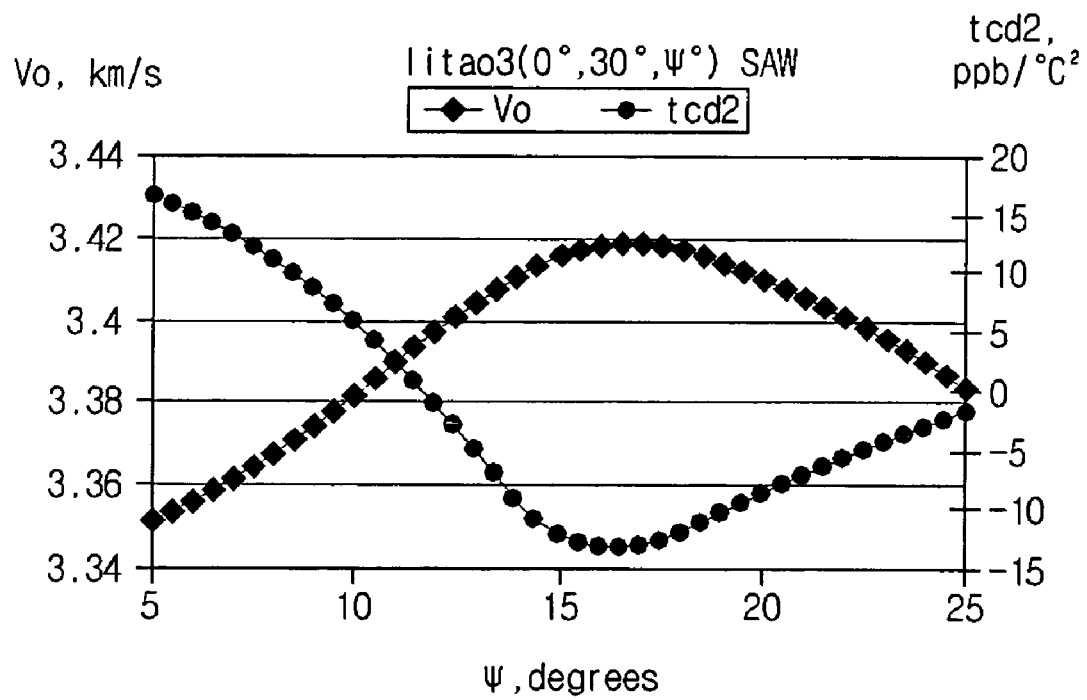
Figure 22:
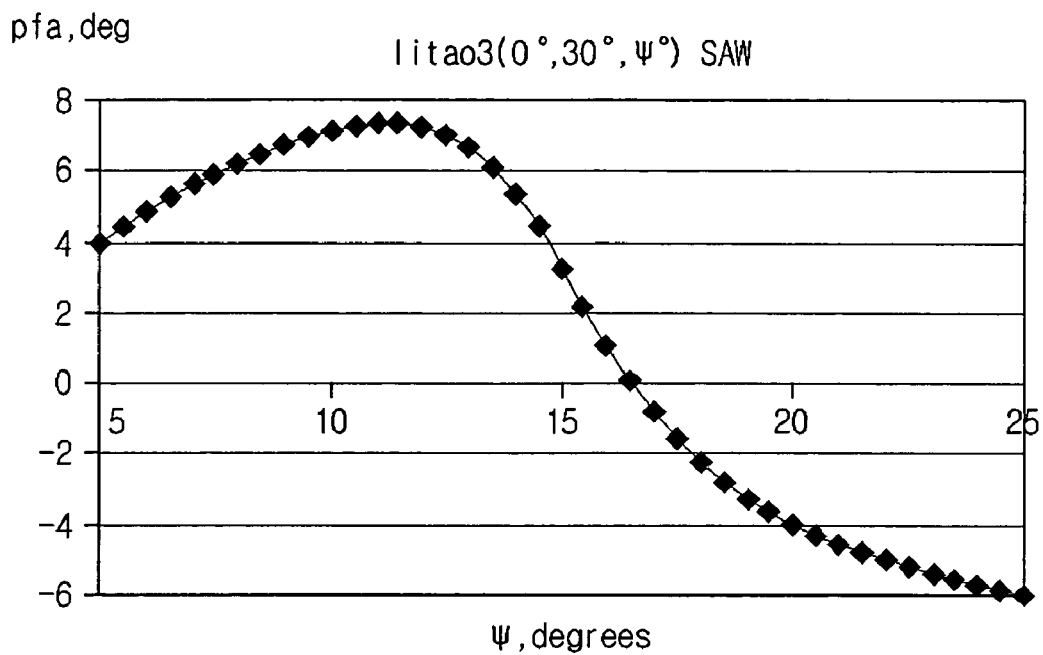
Figure 23:
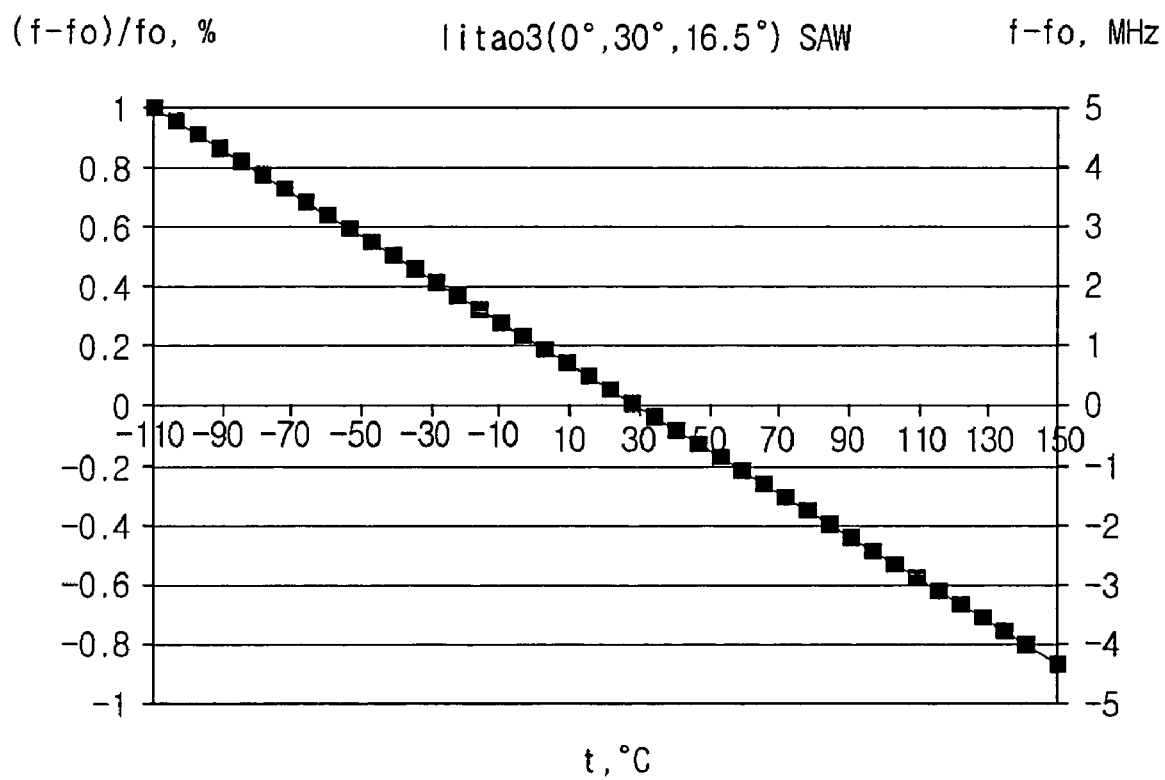
Figure 24:
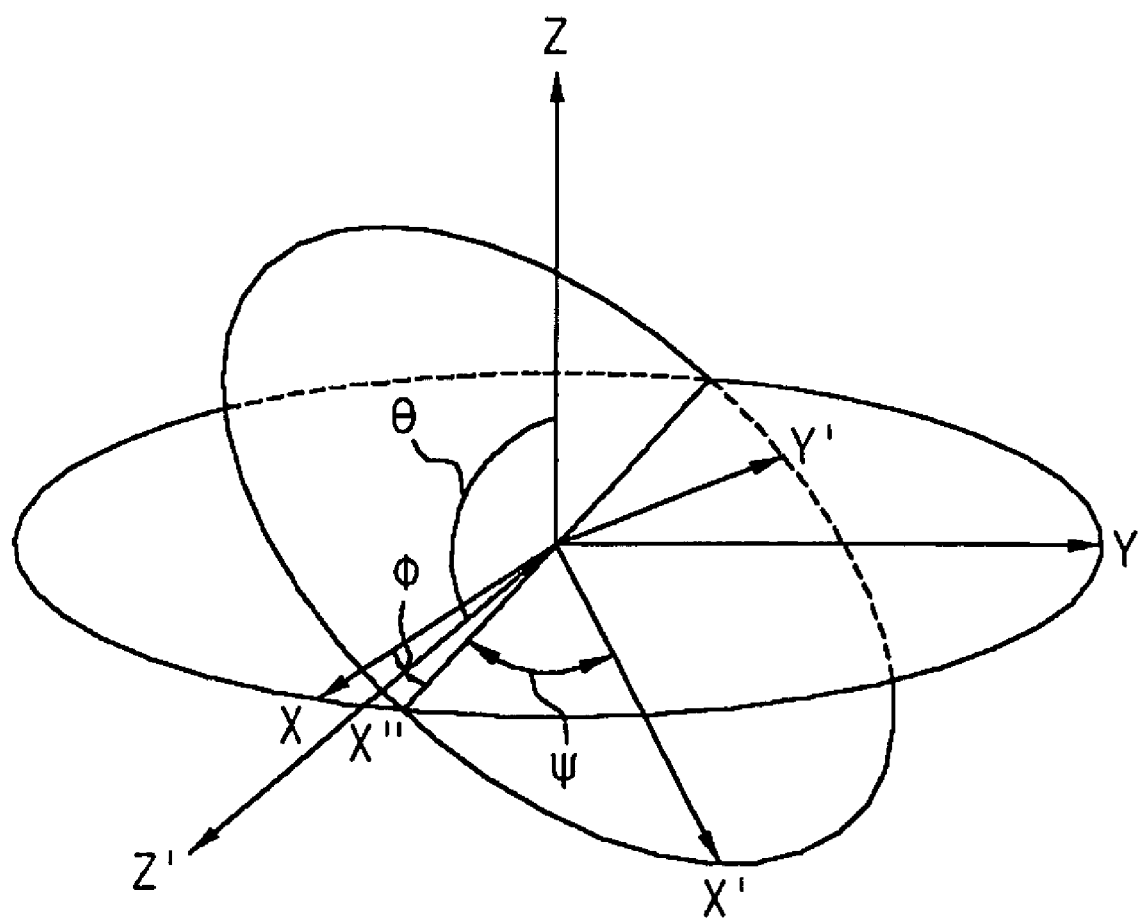
Figure 24:
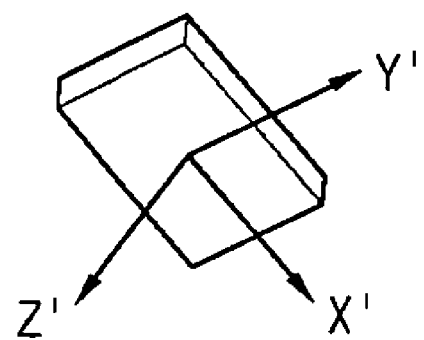

FIG. 14 shows a relationship between the coupling coefficient (K2) and the first order temperature coefficient of delay (tcd) when Euler angles $\phi=0°$, $\theta=\theta°$ ($\theta°$ refers to an arbitrary angle) and $\psi=90°$ in a lithium tantalate substrate of the SAW device according to one embodiment of present invention;

FIG. 15 shows a relationship between the phase velocity for opened surface (Vo) and the second order temperature coefficient of delay (tcd2) when Euler angles $\phi=0°$, $\theta=\theta°$ ($\theta°$ refers to an arbitrary angle) and $\psi=90°$ in the lithium tantalate substrate of the SAW device according to one embodiment of the present invention;

FIG. 16 shows dependency of a frequency on a temperature when Euler angles $\phi=0°$, $\theta=79°$ and $\psi=90°$ in the lithium tantalate substrate of the SAW device according to one embodiment of the present invention;

FIG. 17 shows a relationship between the coupling coefficient (K2) and the first order temperature coefficient of delay (tcd) when Euler angles $\phi=0°$, $\theta=\theta°$ ($\theta°$ refers to an arbitrary angle) and $\psi=90°$ in a lithium tantalate substrate of the SAW device according to another embodiment of the present invention;

FIG. 18 shows a relationship between the phase velocity for opened surface (Vo) and the second order temperature coefficient of delay (tcd2) when Euler angles $\phi=0°$, $\theta=\theta°$ ($\theta°$ refers to an arbitrary angle) and $\psi=90°$ in the lithium tantalate substrate of the SAW device according to another embodiment of the present invention;

FIG. 19 shows dependency of a frequency on a temperature when Euler angles $\phi=0°$, $\theta=168°$ and $\psi=90°$ in the lithium tantalate substrate of the SAW device according to another embodiment of the present invention;

FIG. 20 illustrates a relationship between the coupling coefficient (K2) and the first order temperature coefficient of delay (tcd) when Euler angles $\phi=0°$, $\theta=30°$ and $\psi=\psi°$ ($\psi°$ refers to an arbitrary angle) in a lithium tantalate substrate of the SAW device according to still another embodiment of the present invention;

FIG. 21 shows a relationship between the phase velocity for opened surface (Vo) and the second order temperature coefficient of delay (tcd2) when Euler angles $\phi=0°$, $\theta=30°$ and $\psi=\psi°$ ($\psi°$ refers to an arbitrary angle) in the lithium tantalate substrate of the SAW device according to still another embodiment of the present invention;

FIG. 22 is a contour map of pfa when Euler angles $\phi=0°$, $\theta=30°$ and $\psi=\psi°$ ($\psi°$ refers to an arbitrary angle) in the lithium tantalate substrate of the SAW device according to still another embodiment of the present invention;

FIG. 23 shows dependency of a frequency on a temperature when Euler angles $\phi=0°$, $\theta=30°$ and $\psi=16.5°$ in the lithium. tantalate substrate of the SAW device according to another embodiment of the present invention; and FIG. 24 is an explanatory diagram of Euler angles of the related art.

BEST MODE FOR CARRYING OUT THE INVENTION

The following detailed description will present a single crystal substrate and a cutting method thereof according to a preferred embodiment of the invention in reference to the accompanying drawings.

<Embodiment 1>

FIG. 4 is a contour map of pfa when Euler angle $\phi=10°$ in a langasite substrate of the SAW device according to one embodiment of the present invention, and FIG. 5 is a contour map of tcd when Euler angle $\phi=10°$.

As depicted in the drawings, that points, in which pfa and tcd are equal to zero simultaneously, is about $\theta=23.6°$ and $\psi=78.8°$.

FIG. 6 is a flowchart illustrating a simulation method of a single crystal substrate of an SAW device according to the present invention.

Referring to FIG. 6, the simulation process of the single crystal substrate is as described below. The user first inputs material and temperature constants of the crystal, temperature, search ranges and Euler angles (S11).

The user then transforms the constants from the crystalographical coordinate system to the working coordinate system (S12). Thereafter, the user seeks solutions of a dispersion equation for the bulk waves, i.e., $V_{s1}$, $V_{s2}$, $V_1$ (S13).

Next, the user then sets of the velocity and attenuation initial values (S14), and forms the dispersion equation (S15).

The dispersion equation is formed as an equation for roots $\beta$ (S16). The user then calculates the roots of $\beta^i$ (S17).

Among the calculated roots, the user selects a root of Im $\beta^i<0$, which is equivalent to y of the complex roots of x+jy (S18).

Subsequently, the user calculates square of an absolute value of the boundary condition function (S19). Thereafter, the user determines whether or not the calculated square of an absolute value of the boundary condition function is a minimum value (S20).

Where, if it is a minimum value, the user calculates main characteristics of the wave (S21). And, the simulation method of a single crystal substrate of an SAW device according to the present invention ends. If it is not, the user changes the values of velocity and attenuation (S22), and repeats the steps S14 to S20.

The following are the results of main characteristics of the wave calculated according to the simulation process as shown in FIG. 6 with respect to the Euler angles (10°, 23.6°, 78.8°).

More exact calculation through the Euler angles' simulation gives following result for each parameter given that the Euler angles $\phi=10°$, $\theta=23.6°$ and $\psi=78.8°$. Vs (km/s)= 2.969688, Vo (km/s)=2.972704, K2 (%)=0.2029, pfa (deg)= 0.03048, tcd (ppm/C)=−0.06127, and tcd2 (1e-9/C^2)=−3.496.

Where, Vs and Vo are phase velocities for shorted and opened (free) surface respectively, K2 is coupling coefficient, pfa is power flow angle, tcd and tcd2 are first and second order temperature coefficient of delay respectively.

Here, it is better to have a high optimal K2, and optimal values for the pfa, tcd and tcd2 are preferably close to zero. Vs and Vo, on the other hand, have different optimal values depending on cases. And this is because Vs and Vo values is changed when desired frequency is fixed pursuant to f=v/λ, where f, v, and λ is frequency, velocity, wave length of the wave respectively.

However, since it is very difficult to satisfy all the required optimal values for the parameters, approximately optimal values are usually used. The best ranges of Euler angles are $8°\leq\phi\leq25°$, $15°\leq\theta\leq30°$ and $55°\leq\psi\leq85°$.

FIG. 7 illustrates temperature dependencies for Euler angles (10°, 23.6°, and 78.8°) in the langasite substrate of the SAW device according to one embodiment of the present invention, and FIG. 8 illustrates temperature dependencies for Euler angles (0°, 138.5°, and 26.6°) in a langasite substrate of the SAW device of the related art.

Comparing FIGS. 7 and 8, it is found that temperature dependencies for the langasite Euler angles is stable.

Therefore, within the suggested orientation groups it is always possible to find similar values for other two angles for any orientations. Also, the combination of the two values is better to improve temperature stability and to reduce insertion loss.

FIG. 9 is a contour map of propagation loss for LGS SAW when Euler angle $\phi=0°$ in the langasite substrate of the SAW device according to another embodiment of the present invention.

As depicted in the drawing, the minimum loss is obtained when the Euler angle is $\phi=0°$, $\theta=14.6°$ and $\psi=76.2°$.

According to parameter values obtained from the simulation using the Euler angles (0°, 14.6°, 76.2°), Vs (km/s)= 3.402727, Vo (km/s)=3.04514, K2 (%)=0.1585, pfa (deg)=−4.556, tcd (ppm/C)=30.176, tcd2 (1e-9/C^2)=51.942, loss_s (dB/X)=0.0006225, and loss_o (dB/k)=2.19E-05. Where, Vs and Vo are phase velocities for shorted and opened (free) surface respectively, K2 is coupling coefficient, pfa is power flow angle, tcd and tcd2 are first and second order temperature coefficients of delay respectively, and loss_s and loss_o are propagation loss for shortened and opened surface respectively.

As such, the langasite single crystal substrate on the SAW device has lower loss and high coupling coefficient, and shows good temperature stability in a wide range of working temperatures.

However, since it is very difficult to satisfy all the required optimal values for the parameters, approximately optimal values are usually used. The best ranges of Euler angles are $\phi=0°$, $12°\leq\theta\leq17°$ and $73°\leq\psi\leq78°$.

<Embodiment 2>

FIG. 10 shows a relationship between coupling coefficient (K2) and the first order temperature coefficient of delay (tcd) when Euler angles $\phi=0°$, $\theta=\theta°$ ($\theta°$ refers to an arbitrary angle) and $\psi=0°$ in a quartz substrate of the SAW device according to one embodiment of the present invention, and FIG. 11 shows a relationship between phase velocity (Vo) and the second order temperature coefficient of delay (tcd2) when Euler angles $\phi=0°$, $\theta=\theta°$ ($\theta°$ refers to an arbitrary angle) and $\psi=0°$.

As depicted in FIGS. 10 and 11, the maximum value of the coupling coefficient corresponds to when the Euler angle $\theta\approx70°$.

According to parameter values obtained from the simulation using the Euler angles (0°, 70.5°, 0°), Vs (km/s)= 3.205561, Vo (km/s)=3.208859, K2 (%)=0.2056, pfa (deg)= 0, tcd (ppm/C)=−27.78, tcd2 (1e-9/C^2)=2.5308, and gamma=1.214.

To use the SAW device as a temperature sensor and to increase its applicability and usefulness, the coupling coefficient and the first order temperature coefficient of delay should be great, the second order temperature coefficient of delay and pfa (power flow angle) should be close to zero, and the gamma value should be close to −1.

FIG. 12 shows dependency of a frequency on a temperature when Euler angles $\phi=0°$, $\theta=70.5°$ and $\psi=0°$ in the quartz substrate of the SAW device according to one embodiment of the present invention.

However, the quartz single crystal substrate on the SAW device does not have optimal parameter values as required so approximately optimal values are usually used. The best ranges of Euler angles are $-5°\leq\phi\leq+5°$, $60°\leq\theta\leq80°$ and $-5\leq\psi\leq+5°$.

FIG. 13 illustrates minimum propagation loss for opened (free) surface when Euler angles $\phi=0°$, $\theta=20°$ and $\psi=13.7°$ in the quartz substrate of the SAW device according to another embodiment of the present invention.

As depicted in FIG. 13, the minimum loss is obtained when the Euler angle corresponds to $\phi=0°$.

Also according to parameter values obtained from the simulation using the Euler angles (0°, 20°, 13.7°), Vs (km/s)=3.861097, Vo (km/s)=3.86422, K2 (%)=0.1618, pfa (deg)=−4.812, tcd (ppm/C)=4.4367, tcd2 (1e-9/C^2)=−22.03, loss_s (dB/X)=0.0001331, and loss_o (dB/k)=7.50E-06.

As such, the quartz single crystal substrate on the SAW device has lower loss and high coupling coefficient, compared to the SAW device of the related art. Although the pfa and tad values are slightly worse than the SAW device of the related art, they do not have a great impact on the performances of the device at all.

However, since it is very difficult to satisfy all the required optimal values for the parameters, approximately optimal values are usually used. The best ranges of Euler angles are $\phi=0°$, $17°\leq\theta\leq23°$ and $10°\leq\psi\leq20°$.

<Embodiment 3>

FIG. 14 shows a relationship between the coupling coefficient (K2) and first order temperature coefficient of delay (tcd) when Euler angles $\phi=0°$, $\theta=\theta°$ ($\theta°$ refers to an arbitrary angle) and $\psi=90°$ in a lithium tantalate substrate of the SAW device according to one embodiment of present invention, and FIG. 15 shows a relationship between phase velocity (Vo) and the second order temperature coefficient of delay (tcd2) when Euler angles $\phi=0°$, $\theta=\theta°$ ($\theta°$ refers to an arbitrary angle) and $\psi=90°$.

As depicted in FIGS. 14 and 15, the maximum value of the coupling coefficient dependent on the first and the second order temperature coefficient of delay corresponds to when θ=79°.

According to parameter values obtained from the simulation using the Euler angles (0°, 79°, 90°), Vs (km/s)=3.247331, Vo (km/s)=3.26343, K2 (%)=0.9867, pfa (deg)=0, tcd (ppm/C)=32.833, tcd2 (1e-9/C^2)=−19.419, and gamma=−0.4199.

To use the SAW device as a temperature sensor and to increase its applicability and usefulness, the coupling coefficient and the first order temperature coefficient of delay should be great, the second order temperature coefficient of delay and pfa (power flow angle) should be close to zero, and the gamma value should be close to −1.

FIG. 16 shows dependency of a frequency on a temperature when Euler angles φ=0°, θ=79° and ψ=90° in the lithium tantalate substrate of the SAW device according to one embodiment of the present invention.

However, the lithium tantalate single crystal substrate on the SAW device does not have optimal parameter values as required so approximately optimal values are usually used. The best ranges of Euler angles are −5°≦φ≦+5°, 70°≦θ≦90° and 85°≦ψ≦95°.

FIG. 17 shows a relationship between the coupling coefficient (K2) and the first order temperature coefficient of delay (tcd) when Euler angles φ0°, θ=θ° (θ° refers to an arbitrary angle) and ψ=90° in a lithium tantalate substrate on the SAW device according to another embodiment of the present invention, and FIG. 18 shows a relationship between phase velocity (Vo) and the second order temperature coefficient of delay (tcd2) when Euler angles φ=0°, θ=θ° (θ° refers to an arbitrary angle) and ψ=90°.

As depicted in FIGS. 17 and 18, the maximum value of the coupling coefficient dependent on the first and the second order temperature coefficient of delay corresponds to when θ=168°.

According to parameter values obtained from the simulation using the Euler angles (0°, 168°, 90°), Vs (km/s)=3.360127, Vo (km/s)=3.383842, K2 (%)=1.402, pfa (deg)=0, tcd (ppm/C)=75.33, tcd2 (1e-9/C^2)=0.78342, and gamma=−1.113.

To use the SAW device as a temperature sensor and to increase its applicability and usefulness, the coupling coefficient and the first order temperature coefficient of delay should be great, the second order temperature coefficient of delay and pfa (power flow angle) should be close to zero, and the gamma value should be close to −1.

FIG. 19 shows dependency of a frequency on a temperature when Euler angles φ=0°, θ=168° and ψ=90° in the lithium tantalate substrate of the SAW device according to another embodiment of the present invention.

However, the lithium tantalate single crystal substrate on the SAW device of this embodiment does not have optimal parameter values as required so approximately optimal values are usually used. The best ranges of Euler angles are −5°≦φ≦+5°, 160°≦θ≦180° and 85°≦ψ≦95°.

FIG. 20 illustrates a relationship between coupling coefficient (k2) and the first order temperature coefficient of delay (tcd) when Euler angles φ=0°, θ=30° and ψ=ψ° (ψ° refers to an arbitrary angle) in a lithium tantalate substrate of the SAW device according to still another embodiment of the present invention, and FIG. 21 shows a relationship between coupling phase velocity (Vo) and the second order temperature coefficient of delay (tcd2) when Euler angles φ=0°, θ=30° and ψ=ψ° (ψ° refers to an arbitrary angle).

As shown in FIGS. 20 and 21, the maximum coupling coefficient corresponds to when ψ=16.5°.

FIG. 22 is a contour map of pfa when Euler angles φ=0°, θ=30° and ψ=ψ° (ψ° refers to an arbitrary angle) in the lithium tantalate substrate of the SAW device according to still another embodiment of the present invention.

As depicted in FIG. 22, the pfa value at φ=0° and θ=30° is close to zero when ψ=16.5°.

According to parameter values obtained from the simulation using the Euler angles (0°, 30°, 16.5°), Vs (km/s)=3.387511, Vo (km/s)=3.418243, K2 (%)=1.789, pfa (deg)=0.1585, tcd (ppm/C)=70.869, tcd2 (1e-9/C^2)=−13.278, and gamma=1.873.

To use the SAW device as a temperature sensor and to increase its applicability and usefulness, the coupling coefficient and the first order temperature coefficient of delay should be great, the second order temperature coefficient of delay and pfa (power flow angle) should be close to zero, and the gamma value should be close to −1.

FIG. 23 is a graph showing dependency of a frequency on a temperature when Euler angles φ=0°, θ=30° and ψ=16.5° in the lithium tantalate substrate of the SAW device according to another embodiment of the present invention.

However, the lithium tantalate single crystal substrate on the SAW device does not have optimal parameter values as required so approximately optimal values are usually used. The best ranges of Euler angles are −5°≦φ≦+5°, 20°≦θ≦40° and 5°≦ψ<25°.

The following will explain about the Euler angles.

FIG. 24 is a diagram explaining about the Euler angles of the related art.

As illustrated in the drawing, it is supposed that the direction of SAW propagation is parallel to X'-axis, and a wafer (substrate) contour is drawn on a surface parallel to Z'-axis. As such, the direction of wave propagation is parallel to one edge of the wafer that is perpendicular to the X' axis.

Provided that modified axes X, Y and Z are coincident with the wafer outline axes X', Y' and Z', respectively. With no rotation, the wafer is regarded as Z cut, i.e. the wafer is cut with the polished surface normal to the Z-axis, and the SAW propagates in the direction parallel to the X-axis.

With any subsequent rotation, the wafer axes X', Y' and Z' are rotated, and the modified axes X, Y and Z are assumed to be fixed. For instance, suppose that the Euler angles (φ, θ, ψ)=(0°, 135°, 28°), which is a case near the middle of the designated range. Then the first rotation would take place around the Z'-axis (X' toward Y') by φ. Because φ=0°, there is no rotation for this case.

The next rotation takes place around the 'new' X'. Here, the new axes are always coupled to the wafer so that any rotation takes place around a wafer axis that includes all previous rotations by θ.

Finally, rotation takes place around Z' (X' toward Y') by ψ, namely 28° for this case. The wafer axes X', Y' and Z' are defined as relative orientation Euler angles φ, θ, ψ.

Therefore, within the suggested orientation groups it is always possible to find similar values for other two angles for any orientations. Also, the combination of the two values is preferred to improve parameter characteristics.

INDUSTRIAL APPLICABILITY

In conclusion, the single crystal substrate and the cutting method thereof can be advantageously used for obtaining optimal parameter characteristics, by applying optimal SAW orientations of the single crystal lanthane gallium silicate (La$_3$Ga$_5$SiO$_{14}$) called langasite of the SAW device.

Optimal parameter characteristics can also be obtained by applying optimal cutting orientations of the quartz single crystal substrate, one of single crystal substrates used in the SAW device.

The same result can be obtained by applying optimal cutting orientations to utilize lithium tantalate (LiTaO$_3$), one of single crystal substrates used in the SAW device.

Also the single crystal substrate is used, for example, in a SAW Filter, and a sensor using SAW.

While the invention has been shown and described with reference to certain preferred embodiments thereof, it will be understood by those skilled in the art that various changes in form and details may be made therein without departing from the spirit and scope of the invention as defined by the appended claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

The invention claimed is:

1. A single crystal substrate comprising:
   a langasite substrate with a SAW propagation surface; and
   input and output IDTs having electrodes on the surface for launching and/or detecting surface acoustic waves, wherein a direction of surface wave propagation is parallel to an X'-axis, and the substrate further has an Z'-axis perpendicular to the surface and a Y'-axis parallel to the surface and perpendicular to the X'-axis, the langasite substrate having a crystal orientation defined by modified axes X, Y and Z, the relative orientation of axes X', Y' and Z' being defined by Euler angles $\phi$, $\theta$ and $\psi$, in which $\phi$ is 0°, $\theta$ is in a range of 12°≦$\theta$≦17°, and $\psi$ is in a range of 73°≦$\psi$≦78°.

2. The single crystal substrate according to claim 1, wherein optimal Euler angles of the langasite are $\phi$=0°, $\theta$=14.6° and $\psi$=76.2°.

3. A single crystal substrate comprising:
   a quartz substrate with a SAW propagation surface; and
   input and output IDTs having electrodes on the surface for launching and/or detecting surface acoustic waves, wherein a direction of surface wave propagation is parallel to an X'-axis, and the substrate further has an Z'-axis perpendicular to the surface and a Y'-axis parallel to the surface and perpendicular to the X'-axis, the quartz substrate having a crystal orientation defined by modified axes X, Y and Z, the relative orientation of axes X', Y' and Z' being defined by Euler angles $\phi$, $\theta$ and $\psi$, in which $\phi$ is in a range of −5°≦$\phi$≦+5°, $\theta$ is in a range of 60°≦$\theta$≦80° and $\psi$ is in a range of −5°≦$\psi$≦+5°.

4. The single crystal substrate according to claim 3, wherein optimal Euler angles of the quartz are $\phi$=0°, $\theta$=70.5° and $\psi$=0°.

5. A single crystal substrate comprising:
   a quartz substrate with a SAW propagation surface; and
   input and output TDTs having electrodes on the surface for launching and/or detecting surface acoustic waves, wherein a direction of surface wave propagation is parallel to an X'-axis, and the substrate further has an Z'-axis perpendicular to the surface and a Y'-axis parallel to the surface and perpendicular to the X'-axis, the quartz substrate having a crystal orientation defined by modified axes X, Y and Z, the relative orientation of axes X', Y' and Z' being defined by Euler angles $\phi$, $\theta$ and $\psi$, in which $\phi$ is 0°, $\theta$ is in a range of 17°≦$\theta$≦° and $\psi$ is in a range of 10°≦$\psi$20°.

6. The single crystal substrate according to claim 5, wherein optimal Euler angles of the quartz are $\phi$=0°, $\theta$=20° and $\psi$=13.7°.

7. A single crystal substrate comprising:
   a lithium tantalate substrate with a SAW propagation surface; and
   input and output IDTs having electrodes on the surface for launching and/or detecting surface acoustic waves, wherein a direction of surface wave propagation is parallel to an X'-axis, and the substrate further has an Z'-axis perpendicular to the surface and a Y'-axis parallel to the surface and perpendicular to the X'-axis, the lithium tantalate substrate having a crystal orientation defined by modified axes X, Y and Z, the relative orientation of axes X', Y' and Z' being defined by Euler angles $\phi$, $\theta$ and $\psi$, in which $\phi$ is in a range of −5°≦$\phi$≦+5°, $\theta$ is in a range of 70°≦$\theta$≦90° and $\psi$ is in a range of 85°≦$\psi$≦95°.

8. The single crystal substrate according to claim 7, wherein optimal Euler angles of the lithium tantalate are $\phi$=0°, $\theta$=79° and $\psi$=90°.

9. A single crystal substrate comprising:
   a lithium tantalate substrate with a SAW propagation surface; and
   input and output IDTs having electrodes on the surface for launching and/or detecting surface acoustic waves, wherein a direction of surface wave propagation is parallel to an X'-axis, and the substrate further has an Z'-axis perpendicular normal to the surface and a Y'-axis parallel to the surface and perpendicular to the X'-axis, the lithium tantalate substrate having a crystal orientation defined by modified axes X, Y and Z, the relative orientation of axes X', Y' and Z' being defined by Euler angles $\phi$, $\theta$ and $\psi$, in which $\phi$ is in a range of −5°≦$\phi$≦+5°, $\theta$ is in a range of 160°≦$\theta$≦180° and $\psi$ is in a range of 85°≦$\psi$≦95°.

10. The single crystal substrate according to claim 9, wherein optimal Euler angles of the lithium tantalate are $\phi$=0°, $\theta$=168° and $\psi$=90°.

11. A single crystal substrate comprising:
    a lithium tantalate substrate with a SAW propagation surface; and
    input and output IDTs having electrodes on the surface for launching and/or detecting surface acoustic waves, wherein a direction of surface wave propagation is parallel to an X'-axis, and the substrate further has an Z'-axis perpendicular to the surface and a Y'-axis parallel to the surface and perpendicular to the X'-axis, the lithium tantalate substrate having a crystal orientation defined by modified axes X, Y and Z, the relative orientation of axes X', Y' and Z' being defined by Euler angles $\phi$, $\theta$ and $\psi$, in which $\phi$ is in a range of −5°≦$\phi$≦+5°, $\theta$ is in a range of 20°≦$\theta$≦40° and $\psi$ is in a range of 5°≦$\psi$≦25°.

12. The single crystal substrate according to claim 11, wherein optimal Euler angles of the lithium tantalate are $\phi$=0°, $\theta$=30° and $\psi$=16.5°.

* * * * *